(12) United States Patent
Giusti et al.

(10) Patent No.: US 11,066,294 B2
(45) Date of Patent: Jul. 20, 2021

(54) MICRO-ELECTRO-MECHANICAL ACTUATOR DEVICE OF PIEZOELECTRIC TYPE AND APPARATUS INTEGRATING THE MICRO-ELECTRO-MECHANICAL ACTUATOR DEVICE

(71) Applicant: STMicroelectronics S.r.l., Agrate Brianza (IT)

(72) Inventors: Domenico Giusti, Caponago (IT); Carlo Luigi Prelini, Seveso (IT)

(73) Assignee: STMicroelectronics S.r.l., Agrate Brianza (IT)

(*) Notice: Subject to any disclaimer, the term of this patent is extended or adjusted under 35 U.S.C. 154(b) by 47 days.

(21) Appl. No.: 16/705,522

(22) Filed: Dec. 6, 2019

(65) Prior Publication Data
US 2020/0115218 A1    Apr. 16, 2020

Related U.S. Application Data

(63) Continuation of application No. 16/197,810, filed on Nov. 21, 2018, now Pat. No. 10,532,922.

(30) Foreign Application Priority Data

Feb. 27, 2017    (IT) .................... 102017000135836

(51) Int. Cl.
*H01L 29/82*    (2006.01)
*B81B 3/00*    (2006.01)
(Continued)

(52) U.S. Cl.
CPC ........ *B81B 3/0037* (2013.01); *H01L 41/0933* (2013.01); *H01L 41/0953* (2013.01);
(Continued)

(58) Field of Classification Search
CPC ............. H01L 41/0973; H01L 41/0933; H01L 41/0953; B81B 2203/0127; B81B 3/00;
(Continued)

(56) References Cited

U.S. PATENT DOCUMENTS

2007/0231065 A1* 10/2007 Kim ...................... H01H 57/00
                                                                      403/359.1
2008/0074006 A1    3/2008 Kawakubo et al.
(Continued)

FOREIGN PATENT DOCUMENTS

JP    S59177979 A    10/1984

OTHER PUBLICATIONS

IT Search Report and Written Opinion for IT Appl. No. 1020170000135836 dated Aug. 9, 2018 (9 pages).
(Continued)

*Primary Examiner* — Theresa T Doan
(74) *Attorney, Agent, or Firm* — Crowe & Dunlevy

(57) ABSTRACT

A micro-electro-mechanical (MEMS) actuator device includes a frame, and a first functional sub-structure positioned within the frame and mechanically coupled thereto by supporting elements. The first functional sub-structure is subdivided into first and second portions. The first portion is subdivided into first and second sub-portions separated from one another by a first through trench, and the second portion is subdivided into first and second sub-portions separated from one another by a second through trench. First and second piezo-electric structures are respectively carried by the first and second sub-portions of the first portion. Third and fourth piezo-electric structures are respectively carried by the first and second sub-portions of the second portion. A third through trench extends between the frame and the first functional sub-structure except for regions in which the supporting elements are present.

26 Claims, 7 Drawing Sheets

(51) Int. Cl.
*H04R 17/00* (2006.01)
*H01L 41/09* (2006.01)

(52) U.S. Cl.
CPC ...... *H04R 17/00* (2013.01); *B81B 2201/0257* (2013.01); *B81B 2201/032* (2013.01); *B81B 2203/0127* (2013.01); *H04R 2201/003* (2013.01); *H04R 2217/00* (2013.01)

(58) Field of Classification Search
CPC ..... B81B 7/0032; B81B 7/008; B81B 3/0037; B81B 7/0048; H04R 17/00; H04R 2201/003; H04R 2217/00
USPC ........................................................ 257/416
See application file for complete search history.

(56) References Cited

U.S. PATENT DOCUMENTS

| | | |
|---|---|---|
| 2008/0278035 A1 | 11/2008 | Higashionji et al. |
| 2009/0026892 A1* | 1/2009 | Nakamura ............ H01L 41/094 310/367 |
| 2009/0230818 A1 | 9/2009 | Mukae et al. |
| 2012/0250130 A1 | 10/2012 | Naono |
| 2013/0334928 A1 | 12/2013 | Clark |

OTHER PUBLICATIONS

James D. Ervin et al: "Recurve piezoelectric-strain-amplifying actuator architecture," IEEE / ASME Transactions on Mechatronics, IEEE Service Center, Piscataway, NJ, US , pp. 293-300, plus cover sheet.

* cited by examiner

MICRO-ELECTRO-MECHANICAL ACTUATOR DEVICE OF PIEZOELECTRIC TYPE AND APPARATUS INTEGRATING THE MICRO-ELECTRO-MECHANICAL ACTUATOR DEVICE

RELATED APPLICATION

This application is a continuation of U.S. application for patent Ser. No. 16/197,810, filed on Nov. 21, 2018, which itself claims the priority benefit of Italian Application for Patent No. 1020170000135836, filed on Nov. 27, 2017, the contents of both of which are hereby incorporated by reference in their entirety to the maximum extent allowable by law.

TECHNICAL FIELD

The technology described herein relates to an actuator device based upon piezoelectric technology and to an apparatus, in particular a speaker, which includes the actuator device. In particular, reference will be made hereinafter to an actuator realized via MEMS (Micro-Electro-Mechanical System) technology.

BACKGROUND

Micromechanical actuators are known as having a membrane structure, which is produced with the technology of semiconductor materials. The membrane, provided with one or more piezoelectric elements, is made to deflect in a driving direction by appropriate control of the piezoelectric elements. The mechanical deformation of the membrane has a specific utility according to the application in which it is used. For instance, in fluidic applications, the membrane may form part of a micropump or a printhead, and its deflection may be used to cause displacement of a mass of fluid.

Other applications of micromechanical actuators include, for example, acoustic applications. Piezoeletrically actuated membranes are, for example, used in miniaturized speakers that are integrated in portable apparatuses, such as portable computers, laptops, notebooks (including the ultra-thin notebooks), PDAs, tablets, and smartphones.

Thanks to the small dimensions, said devices make it possible to respect stringent requirements regarding the occupation of space, in terms of both area and thickness.

It has been found that, frequently, the deflection required of membranes of actuators of a known type is of several hundreds of micrometers (500-2000 μm) in a direction orthogonal to the plane of the membrane itself (out-of-plane deflection). This performance may be obtained by increasing the area of the membrane, at the expense of occupation of space.

There is a need in the art to provide a micro-electro-mechanical device with piezoelectric actuation that will overcome the drawbacks of the prior art.

SUMMARY

In an embodiment, a micro-electro-mechanical actuator device includes a fixed structure and a mobile structure. The mobile structure is configured to move along a driving direction and includes a first deformable band, a second deformable band and a third deformable band which lie, in a first operating condition, in a resting plane and have a respective main extension along a first direction orthogonal to the driving direction. The first deformable band is arranged between the second and third deformable bands and is mechanically uncoupled, along the first direction, from the second and third deformable bands by respective first and second through trenches.

The first, second, and third deformable bands each have respective ends and being joined together at their ends.

The second deformable band is further connected to the fixed structure by a first supporting element, and the third deformable band is fixed to the fixed structure by a second supporting element, the first and second supporting elements being aligned to one another, at least in the first operating condition, along a same first axis of symmetry orthogonal to the first direction.

The first, second, and third deformable bands house first, second, and third piezoelectrics, respectively.

The second and third deformable bands and the respective second and third piezoelectrics are arranged with respect to one another and configured so that, in a second operating condition where the second and third piezoelectrics are biased, the second and third deformable bands are subjected to a negative bending that causes a translation of said ends and of the first deformable band in said driving direction.

The first deformable band and the respective first piezoelectric are arranged with respect to one another and configured so that, when the first piezoelectric is biased at the working voltage, the first deformable band is subjected to a positive bending that causes a further translation in the driving direction of at least one portion of the first deformable band, which extends between said ends of the first deformable band.

In an embodiment, a micro-electro-mechanical (MEMS) actuator device includes a frame and a first functional sub-structure positioned within the frame and mechanically coupled thereto by supporting elements. The first functional sub-structure is subvided into first and second portions, the first portion is subdivided into first and second sub-portions separated from one another by a first through trench, and the second portion is subdivided into first and second sub-portions separated from one another by a second through trench. First and second piezo-electric structures are respectively carried by the first and second sub-portions of the first portion, and third and fourth piezo-electric structures are respectively carried by the first and second sub-portions of the second portion. A third through trench extends between the frame and the first functional sub-structure except for regions in which the supporting elements are present.

In an embodiment, a micro-electro-mechanical (MEMS) actuator device includes a frame, and a functional sub-structure positioned within the frame and mechanically coupled thereto by supporting elements. The functional sub-structure is subdivided into first, second, and third portions separated from one another by first and second through trenches. First, second, and third piezo-electric structures are respectively carried by the first, second, and third portions of the functional sub-structure. A third through trench extends between the frame and the functional sub-structure except for regions in which the supporting elements are present.

BRIEF DESCRIPTION OF THE DRAWINGS

For a better understanding, an embodiment is now described, purely by way of non-limiting example, with reference to the attached drawings, wherein.

DETAILED DESCRIPTION

Figure 1:
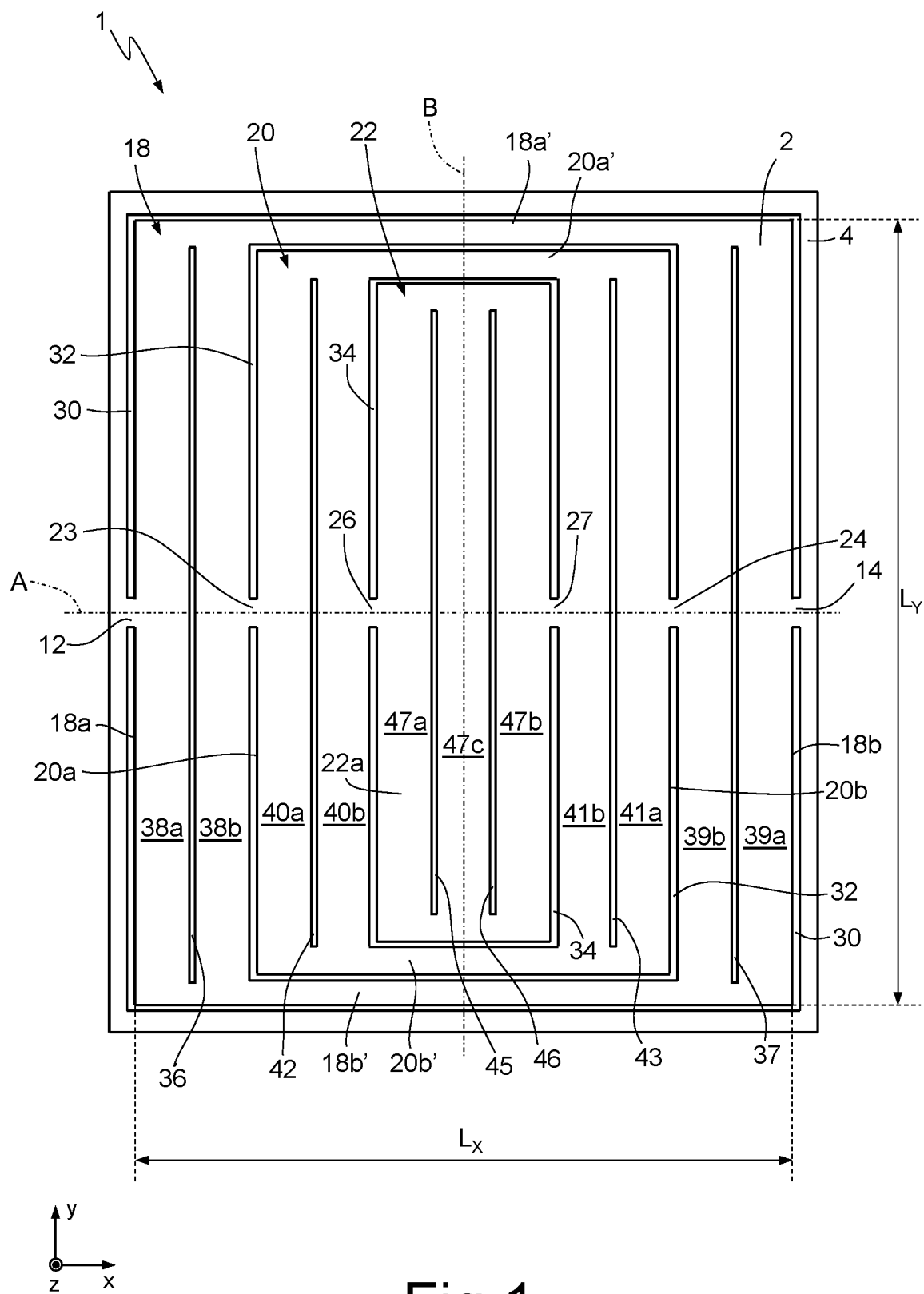
FIG. 1 illustrates, in top plan view, a MEMS actuator according to an aspect of this disclosure.

FIG. 1 illustrates a portion of an actuator 1, of a microelectro-mechanical type, in a triaxial reference system, with mutually orthogonal axes X, Y, Z. In particular, FIG. 1 illustrates the actuator 1 in top view in the plane XY, according to an embodiment.

The actuator 1 is provided with a deformable structure 2 designed to bend in the direction of the axis Z and orthogonal to the plane XY. The deformable structure 2 is supported by a frame 4 of a fixed type, which surrounds the deformable structure 2 completely. In a different embodiment, not illustrated, the frame 4 may surround the deformable structure 2 only partially.

Figure 3:
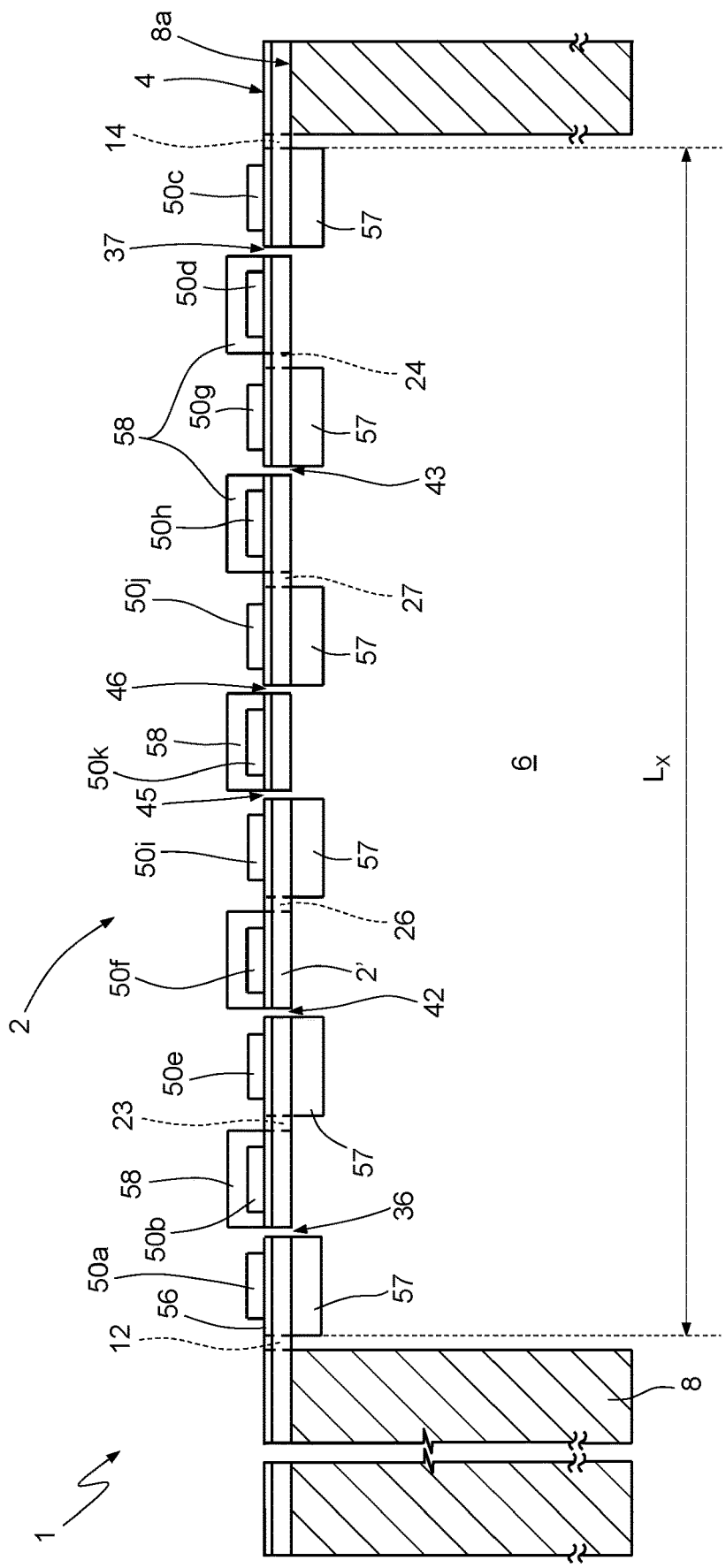
FIG. 3 illustrates, in lateral cross-sectional view, the MEMS actuator of FIG. 2.

As may be seen in FIG. 3, described more fully in what follows, the deformable structure 2 is suspended over a cavity 6 obtained, for example, by etching into a substrate 8 using micromachining techniques. The deformable structure 2 extends, in this embodiment, on a front side 8a of the substrate 8.

It is irrelevant whether the substrate 8 is a monolithic block or else is formed by a plurality of regions or layers arranged on top of one another (e.g., layers grown epitaxially). The substrate 8 may include one or more semiconductor and/or insulating materials. The frame 4 may be integrated in the substrate 8, or else be formed by the substrate 8 itself.

The frame 4 is mechanically coupled to the deformable structure 2 by a first supporting element, or restraint, 12 and a second supporting element, or restraint, 14, which have a shape and size substantially the same as one another and are aligned with one another in a direction parallel to the axis X. In one embodiment, the first supporting element 12 and the second supporting element 14 both lie in a resting condition and in an operating condition (the latter being illustrated more fully in what follows), in the same plane parallel to the plane XY.

The first and second supporting elements 12, 14 are, for example, formed as a local prolongation of the frame 4.

By way of example, the frame 4 has a quadrangular shape, with extension along the axis X of approximately 2 mm and extension along the axis Y of approximately 2 mm. The first and second supporting elements 12, 14 have, by way of example, a quadrangular shape, with extension along the axis X of approximately 20 µm and extension along the axis Y of approximately 85 µm.

The thickness, along the axis Z, of the first and second supporting elements 12, 14 is approximately 4 µm.

In one embodiment, the frame 4 includes, for example, a layer of (monocrystalline or polycrystalline) silicon, deposited or grown on the front side 8a of the substrate 8; it is evident that other materials may be used, in addition to or instead of silicon.

The above layer of (monocrystalline or polycrystalline) silicon, deposited or grown on the front side 8a of the substrate 8, likewise forms, according to an embodiment, a base supporting layer 2' that defines the shape of the deformable structure 2 (see, for example, FIG. 3).

The thickness, measured along the axis Z, of the base supporting layer 2' is, for example, between 0.5 µm and 20 µm.

In one embodiment, the frame 4, the first and second supporting elements 12, 14, and the deformable structure 2 are made of a single piece and, in the resting condition, lie in the same plane (here, the plane XY).

The deformable structure 2 and the supporting frame 4 may be obtained starting from a wafer of semiconductor material, for example silicon, using semiconductor-machining techniques, such as etching, growth, deposition, and/or selective removal.

The deformable structure 2 here has a quadrangular shape, in particular rectangular with a major side $L_Y$ along the axis Y and a minor side $L_X$ along the axis X. For instance, the major side $L_Y$ is 2.5 mm, and the minor side $L_X$ is 2 mm.

The deformable structure 2 is further symmetrical both with respect to an axis of symmetry A, parallel to the axis X and passing through a geometrical center O of a rectangle of sides $L_Y$ and $L_X$ that defines the outer edges of the deformable structure 2, and with respect to an axis of symmetry B, parallel to the axis Y and passing through the geometrical center O. The first and second supporting elements 12, 14 are aligned with respect to one another along the axis of symmetry A and symmetrical with respect to the axis of symmetry A; they are further symmetrical to one another with respect to the axis of symmetry B.

The deformable structure 2 comprises a first functional sub-structure 18, a second functional sub-structure 20, and a third functional sub-structure 22. The first, second, and third functional sub-structures 18, 20, and 22 also have a quadrangular shape, in particular a rectangular shape. The first, second, and third functional sub-structures 18, 20, and 22 have respective outer edges that define respective mutually concentric rectangles, i.e., ones having the same geometrical center, corresponding to the geometrical center O of the rectangle of sides $L_Y$ and $L_X$ mentioned above.

The first, second, and third functional sub-structures 18, 20, and 22 are mechanically coupled together by coupling or restraint elements 23, 24 and 26, 27. The coupling elements 23 and 24 couple the first functional sub-structure 18 to the second functional sub-structure 20, extend symmetrically with respect to the axis of symmetry B, and are aligned along the first axis of symmetry A (along the axis X). The coupling elements 23 and 24 are likewise aligned, along the axis A, to the first and second supporting elements 12 and 14. The coupling elements 26 and 27 constrain the second functional sub-structure 20 to the third functional sub-structure 22 and extend symmetrically to one another with respect to the axis of symmetry B, and are aligned, along the first axis of symmetry A, to the first and second supporting elements 12, 14 and to the coupling elements 23 and 24.

In other words, the frame 4 and the first, second, and third functional sub-structures 18, 20, and 22 are mutually coplanar and lie, in the resting condition, in the plane XY, and extend so that: the frame 4 surrounds completely, in the plane XY, the first functional sub-structure 18; the first functional sub-structure 18 surrounds completely, in the plane XY, the second functional sub-structure 20; and the second functional sub-structure 20 surrounds completely, in the plane XY, the third functional sub-structure 22. The first, second, and third functional sub-structures 18, 20, and 22 are held in position above the cavity 6 by the first and second supporting elements 12, 14 and by the coupling elements 23, 24, 26, and 27.

It may further be noted that the frame 4 is separated from the first functional sub-structure 18 by a first through trench 30, which extends along the axis Z throughout the thickness of the deformable structure 2, and extends, in the plane XY, between the frame 4 and the first functional sub-structure 18 except for the restraint regions provided by the first and second supporting elements 12, 14.

The second functional sub-structure 20 is separated from the first functional sub-structure 18 by a second through trench 32, which extends between the first and second functional sub-structures 18, 20 except for the restraint regions provided by the coupling elements 23, 24.

The third functional sub-structure 22 is separated from the second functional sub-structure 20 by a third through trench 34, which extends between the second and third functional sub-structures 20, 22 except for the restraint regions provided by the coupling elements 26, 27.

In detail, the first, second, and third functional sub-structures 18, 20, and 22 each include a plurality of actuation arms, designated, respectively, by the reference numbers 18*a*, 18*b*; 20*a*, 20*b*; and 22*a*. The actuation arms are mutually parallel and have a direction of main extension along the axis Y. Further, the actuation arm 18*a* is symmetrical, with respect to the axis of symmetry B, to the actuation arm 18*b*; the actuation arm 20*a* is symmetrical, with respect to the axis of symmetry B, to the actuation arm 20*b*; finally, the actuation arm 22*a* extends along the axis of symmetry B and comprises the geometrical center O of the deformable structure 2. Observed with respect to the axis of symmetry B, the actuation arm 22*a* is also symmetrical.

Each of the first, second, and third functional sub-structures 18, 20, and 22 further comprises a plurality of connection arms, designated, respectively, by the reference numbers 18*a*', 18*b*'; 20*a*', 20*b*', which extend in a direction transverse to the connection arms 18*a*, 18*b*, and 20*a*', 20*b*', respectively. The connection arms 18*a*', 18*b*', 20*a*', 20*b*' are mutually parallel and have a direction of main extension along the axis X. The connection arms 18*a*' and 18*b*' are mechanically coupled to the actuation arms 18*a*, 18*b*, at opposite ends of the actuation arms 18*a*, 18*b*. In other words, the connection arm 18*a*' mechanically connects one end of the actuation arm 18*a* to a respective end of the actuation arm 18*b*, while the connection arm 18*b*' mechanically connects the other end of the actuation arm 18*a* to another respective end of the actuation arm 18*b*.

The connection arms 20*a*' and 20*b*' are mechanically coupled to the actuation arms 20*a*, 20*b* in a way similar to what has been described previously, i.e., at opposite ends of the actuation arms 20*a*, 20*b*.

The connection arms 18*a*' and 20*a*' are symmetrical to the connection arms 18*b*', 20*b*', respectively, when they are considered with respect to the axis of symmetry A.

It is evident that, in one embodiment, the connection arms extend as a prolongation of the ends of the actuation arms to which they are coupled without any discontinuity (i.e., without a break in continuity); for example, they are formed in a common layer of material and by manufacturing steps that are at least in part in common.

According to a further aspect, the actuation arm 18*a* has a through trench 36, which extends along the axis Z throughout the thickness of the actuation arm 18*a*, and has a direction of main extension parallel to the axis Y; the through trench 36 divides the arm 18*a* into two sub-portions 38*a*, 38*b*, in part uncoupling them. The sub-portions 38*a*, 38*b* are, in fact, designed to bend, in use, in the direction of the axis Z, but with orientations opposite to one another (e.g., the sub-portion 38*a* may bend in the negative direction of the axis Z, and at the same time the sub-portion 38*b* may bend in the positive direction of the axis Z).

The actuation arm 18*b* is similar to the actuation arm 18*a*, and has a respective through trench 37 that extends along the axis Z throughout the thickness of the actuation arm 18*b*, and has a direction of main extension parallel to the direction of the axis Y; the through trench 37 divides the actuation arm 18*b* into two sub-portions 39*a*, 39*b* uncoupling them in part so that they will be able to bend independently of one another with opposite orientations in the direction Z (e.g., the sub-portion 39*a* may bend in the negative direction of the axis Z, and at the same time the sub-portion 39*b* may bend in the positive direction of the axis Z).

As described above, the actuation arm 20*a* has a through trench 42 that extends along the axis Z throughout the thickness of the actuation arm 20*a*, and has a direction of main extension parallel to the direction of the axis Y; the through trench 42 divides the actuation arm 20*a* into two sub-portions 40*a*, 40*b* designed to bend independently of one another with opposite orientations in the direction Z (e.g., the sub-portion 40*a* may bend in the negative direction of the axis Z, and at the same time the sub-portion 40*b* may bend in the positive direction of the axis Z).

The arm 20*b* is similar to the actuation arm 20*a*, and has a respective through trench 43 that extends along the axis Z throughout the thickness of the actuation arm 20*b* and has a direction of main extension parallel to the direction of the axis Y; the through trench 43 divides the arm 20*b* into two sub-portions 41*a*, 41*b* designed to bend independently of one another with opposite orientations in the direction Z (e.g., the sub-portion 41*a* may bend in the negative direction of the axis Z, and at the same time the sub-portion 41*b* may bend in the positive direction of the axis Z).

The actuation arm 22 has two through trenches 45, 46, which extend along the axis Z throughout the thickness of the actuation arm 22 and have a direction of main extension parallel to the direction of the axis Y; the through trenches 45, 46 are symmetrical to one another with respect to the axis of symmetry B, and divide the actuation arm 22 into three sub-portions 47*a*, 47*b*, 47*c*, uncoupling them in part and rendering them able to bend independently of one another with opposite orientations in the direction Z (e.g., the sub-portions 47*a* and 47*b* may bend in the negative direction of the axis Z, and at the same time the sub-portion 47*c* may bend in the positive direction of the axis Z).

Figure 2:
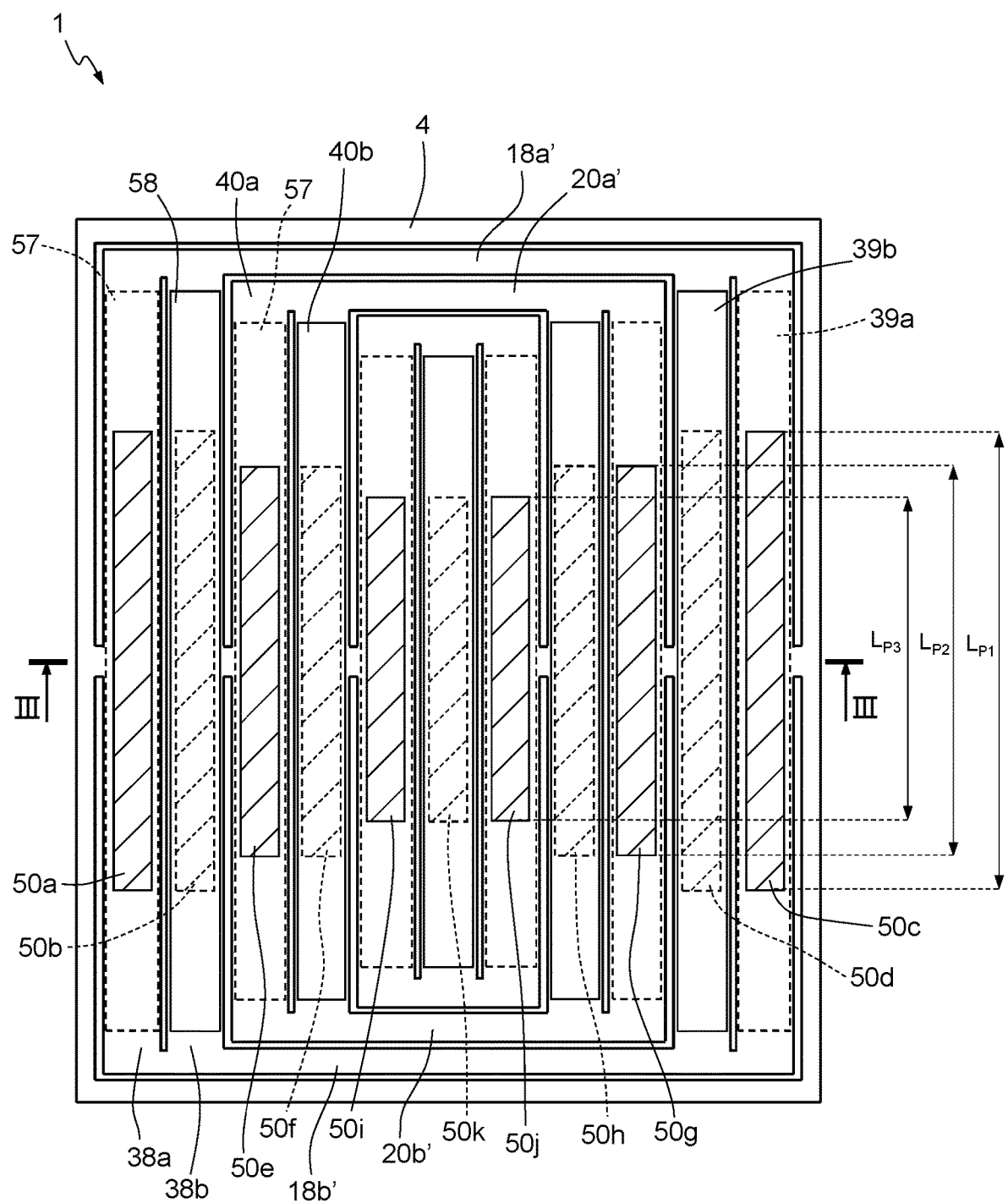
FIG. 2 illustrates, in top plan view, the MEMS actuator of FIG. 1 according to a further aspect of this disclosure.

As illustrated in FIG. 2, each of the sub-portions 38*a*, 38*b*, 39*a*, 39*b*, 40*a*, 40*b*, 41*a*, 41*b*, 47*a*-47*c* carries a respective actuation band 50*a*-50*k*, of piezoelectric material (in what follows, also referred to as "piezoelectric band").

FIG. 3 illustrates the actuator 1 of FIG. 2 in lateral cross-sectional view, in the plane XZ, taken along the line of section of FIG. 2.

Figure 4A:
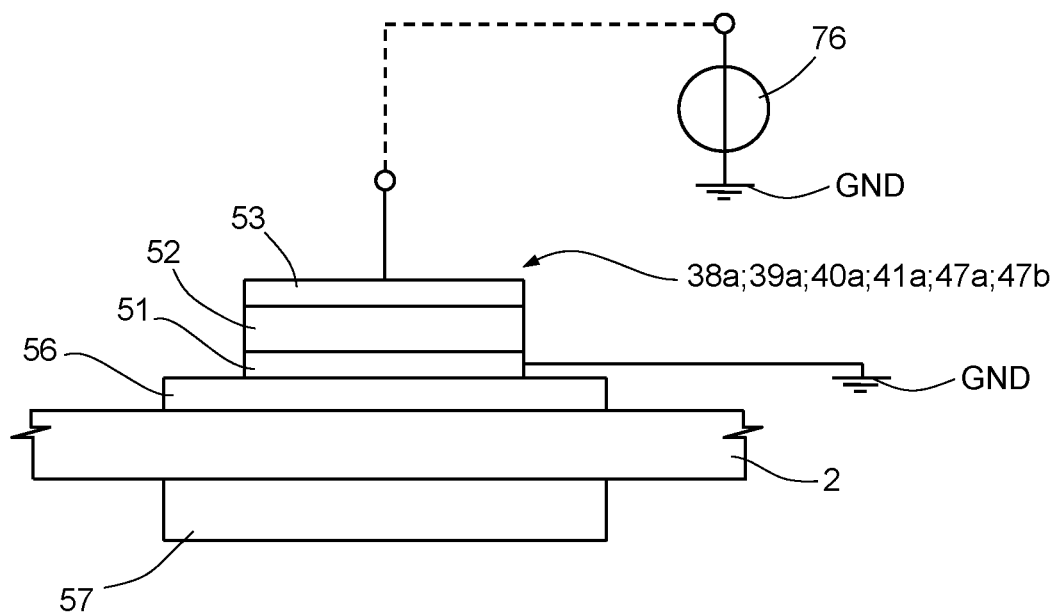
FIGS. 4A and 4B illustrate, with a higher degree of detail, portions of the MEMS actuator of FIG. 3.
Figure 4B:
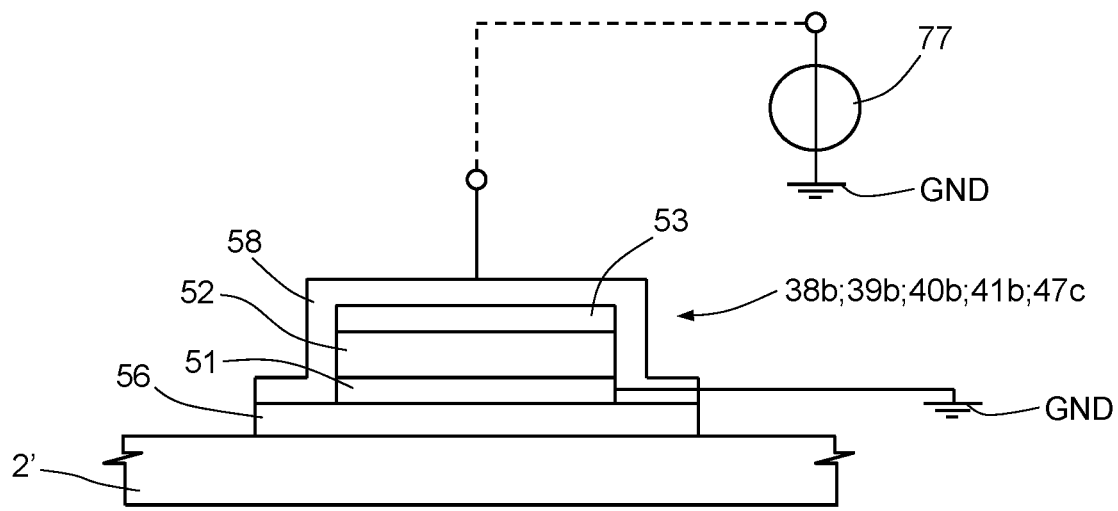

As illustrated in FIGS. 4A and 4B, each piezoelectric band 50*a*-50*k* comprises, in one embodiment, a stack formed by a first electrode 51 (made, for example, of Pt), a layer of piezoelectric material 52 (made, for example, of PZT), and a second electrode 53 (made, for example, of TiW). An insulating layer 56 (e.g., $SiO_2$) extends underneath the respective stack 51-53. Each piezoelectric band 50*a*-50*k* may thus be represented electrically as a capacitor, the first electrode 51 of which is connected to ground and the second electrode 53 of which is biased in the way described hereinafter.

FIG. 4A represents, in particular, the piezoelectric bands 50*a*, 50*c*, 50*e*, 50*g*, 50*i*, 50*j*. In this case, the stack 51-53 extends over the insulating layer 56, which, in turn, extends over the base supporting layer 2'; on an opposite face of the base supporting layer 2', extending in a region corresponding to the stack 51-53 is a thickness-increase layer 57, made, for example, of polysilicon. The thickness, measured along the axis Z, of the thickness-increase layer 57, in the case where it is made of polysilicon, is, for example, 4 µm. Other materials, different from polysilicon, may be used. In this case, the thickness is chosen according to the desired stiffness, the latter being a function of the ratio between Young's modulus and the thickness of the material used. In general, the desired stiffness for the thickness-increase layer 57 is between 100 kPa·m and 1600 kPa·m.

FIG. 4B represents, instead, the piezoelectric bands 50*b*, 50*d*, 50*f*, 50*h*, 50*k*. In this case, the respective stack 51-53 extends over the base supporting layer 2' and the insulating layer 56 and is covered by a thickness-increase layer 58, made, for example, of silicon nitride. The thickness, measured along the axis Z, of the thickness-increase layer 58, in the case where it is made of silicon nitride, is, for example, 3 µm. Other materials, different from silicon nitride, may be used. In this case, the thickness is chosen according to the desired stiffness for the thickness-increase layer 58. In general, the desired stiffness for the thickness-increase layer 58 is between 100 kPa·m and 1600 kPa·m.

From what has been described above, it follows that for each actuation arm 18*a*, 18*b*, 20*a*, 20*b*, and 22*a*, a respective sub-portion 38*b*, 39*b*, 40*b*, 41*b*, and 47*c* carries a respective piezoelectric band 50*b*, 50*d*, 50*f*, 50*h*, 50*k* of the type illustrated in FIG. 4A that is provided with the silicon-nitride structural layer 58 but without the polysilicon structural layer 57. Further, for each actuation arm 18*a*, 18*b*, 20*a*, 20*b* and 22*a*, a respective sub-portion 38*a*, 39*a*, 40*a*, 41*a*, and 47*a*-47*b* carries a respective piezoelectric band 50*a*, 50*c*, 50*e*, 50*g*, 50*i*-50*j* of the type illustrated in FIG. 4B that is without the silicon-nitride structural layer 58 but is provided with the polysilicon structural layer 57.

The piezoelectric bands 50*a*, 50*b*, 50*c*, and 50*d* have a main extension $L_{P1}$, along the axis Y, equal to approximately one half of the extension, along the axis Y, of the corresponding sub-portion 38*a*, 38*b*, 39*a*, 39*b* to which they are coupled (i.e., equal to $L_y/2$). Each piezoelectric band 50*a*, 50*b*, 50*c* and 50*d* is symmetrical with respect to the axis of symmetry A. For instance, the value of $L_{P1}$ is 1300 µm.

The piezoelectric bands 50*e*, 50*f*, 50*h*, and 50*g* have a main extension $L_{P2}$, along the axis Y, equal to approximately one half of the extension, along the axis Y, of the corresponding sub-portion 40*a*, 40*b*, 41*a*, 41*b* to which they are coupled. Each piezoelectric band 50*e*, 50*f*, 50*h*, and 50*g* is symmetrical with respect to the axis of symmetry A. For instance, the value of $L_{P2}$ is 1000 µm.

The piezoelectric bands 50*i*, 50*k*, and 50*j* have a main extension $L_{P3}$, along the axis Y, equal to approximately one half of the extension, along the axis Y, of the corresponding sub-portion 47*a*, 4*cb*, 47*b* to which they are coupled. Each piezoelectric band 50*i*, 50*k*, and 50*j* is symmetrical with respect to the axis of symmetry A. For instance, the value of $L_{P3}$ is 800 µm.

The piezoelectric bands 50*a*, 50*c*, 50*e*, 50*g*, 50*i*, 50*j* are electrically connected to a first voltage generator 76, and the piezoelectric bands 50*b*, 50*d*, 50*f*, 50*h*, 50*k* are electrically connected to a second voltage generator 77 via metal connections illustrated only schematically in FIGS. 4A and 4B in so far as they are in themselves of a known type. The voltage generators 76 and 77 may, in one embodiment, coincide with one another. The voltage generators 76 and 77 are configured to bias the piezoelectric bands at a working voltage, for example comprised between 0 V and 80 V. The working voltage is, in particular, of a unipolar or unidirectional type (i.e., the working voltage is always comprised between zero and the maximum positive or negative voltage; in other words, the supply signal assumes, in time, only negative voltage values or, alternatively, only positive voltage values).

Figure 5B:
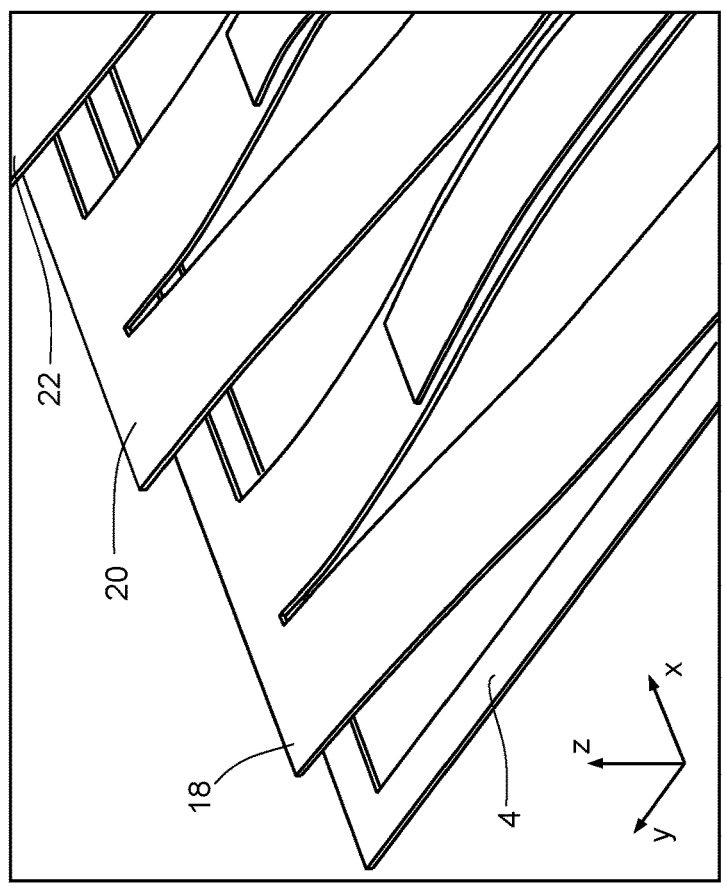
FIG. 5B illustrates an enlarged detail of the MEMS actuator of FIG. 5A.
Figure 5A:
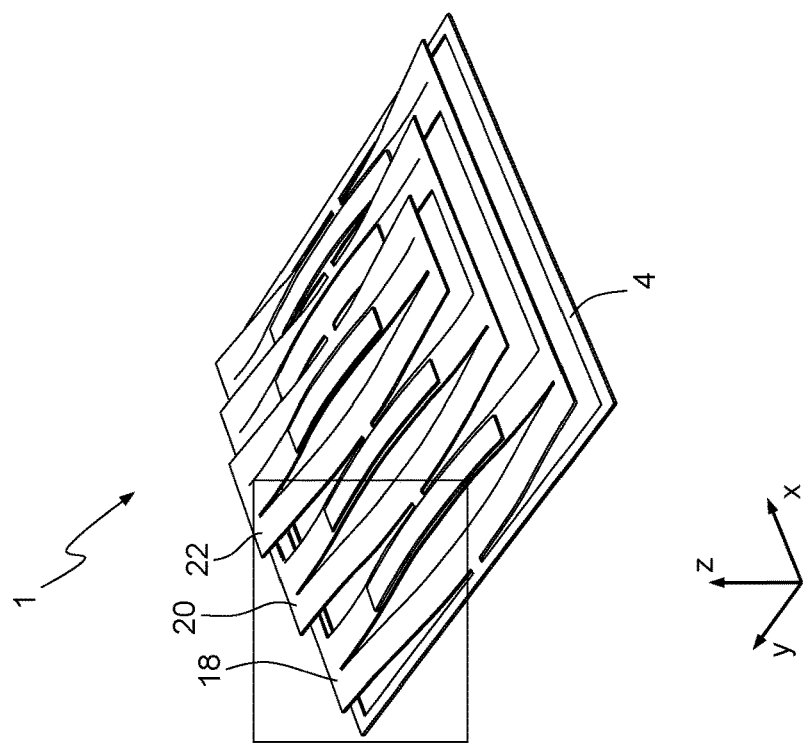
FIG. 5A illustrates, in perspective view, the MEMS actuator according to this disclosure.

FIG. 5A shows schematically, in perspective view, the actuator 1 during an operating condition; FIG. 5B is an enlarged view of the portion represented circled in FIG. 5A.

As may be noted from FIGS. 5A and 5B, when the piezoelectric bands 50*a*-50*k* are biased at the working voltage, they induce a stress in the sub-portions 38*a*-47*c* of the arms 18*a*-22*a* to which they are coupled, which consequently generates bending of the sub-portions 38*a*-47*c* themselves.

The stress induced by the electrical field in the PZT generates a concave or convex deflection in the sub-portions 38*a*-47*c* that is a function of the presence/absence of the thickness-increase layers 57 and 58. In particular, the piezoelectric bands 50*b*, 50*d*, 50*f*, 50*h*, 50*k* generate, in the silicon-nitride layer 58, a tensile stress that, transmitted by the thickness-increase layer 58 to the insulating layer 56 and to the base supporting layer 2', causes a downward bending, also conventionally referred to as "positive bending", of the respective sub-portions 38*b*, 39*b*, 40*b*, 41*b*, and 47*c*. The piezoelectric bands 50*a*, 50*c*, 50*e*, 50*g*, 50*i*-50*j* generate, in the thickness-increase layer 57, a compressive stress that causes an upward bending, also conventionally referred to as "negative bending", of the respective sub-portions 38*a*, 39*a*, 40*a*, 41*a*, and 47*a*-47*b*.

As a result of the fact that the deformable structure 2 is coupled to the frame 4 exclusively by the first and second supporting elements 12, 14, the positive bending of the sub-portions 38*a* and 39*a* causes a displacement, or translation, of the connection arms 18*a'* and 18*b'* in the positive direction of the axis Z (i.e., away from the cavity 6). Since the sub-portions 38*b*, 39*b* are coupled to the connection arms 18*a'* and 18*b'*, they will undergo a similar displacement in the positive direction of the axis Z. Further, as a result of the biasing of the piezoelectric bands 50*b*, 50*d*, the sub-portions 38*b*, 39*b* undergo a negative bending that causes a further displacement, or translation, in the positive direction of the axis Z (i.e., away from the cavity 6), of their portions comprised between the connection arms 18*a'* and 18*b'*. The maximum displacement is obtained at the centroid of the sub-portions 38*b*, 39*b*, i.e., in a position corresponding to the axis of symmetry A.

Since the coupling elements 23, 24 constrain the sub-portions 38*b*, 39*b* to the actuation arms 20*a*, 20*b*, the latter are subjected to a displacement, in the positive direction of the axis Z, equal to the sum of the displacements of the sub-portion 38*a* (respectively 39*a*) and of the sub-portion 38*b* (respectively 39*b*).

In turn, the sub-portions 40*a*-40*b* and 41*a*-41*b*, are subjected to a bending similar to the one described for the sub-portions 38*a*-38*b* and 39*a*-39*b*, respectively.

Since the coupling elements 26, 27 constrain the sub-portions 40*b*, 41*b* to the actuation arm 22, the latter is subjected to a displacement, in the positive direction of the axis Z, equal to the sum of the displacements of the sub-portion 38*a*, of the sub-portion 38*b*, of the sub-portion 40a, and of the sub-portion 40b (corresponding to the sum of the displacements of the sub-portion 39a, of the sub-portion 39b, of the sub-portion 41a, and of the sub-portion 41b).

In turn, the sub-portions 47a and 47b are subjected to a bending similar to the one described for the sub-portions 38a, 39a, 40a, and 41a, while the sub-portion 47c is subjected to a bending similar to the one described for the sub-portions 38b, 40b, 39b, and 41b.

There is thus obtained an effective displacement of the sub-portion 47c in the positive direction of the axis Z equal to the sum of the displacements of the sub-portions 38a, 38b, 40a, 40b, and 47a (equivalent to the sum of the displacements of the sub-portions 39a, 39b, 41a, 41b, and 47b) with respect to a resting condition of lie in the plane XY.

In use, the voltage generators 76, 77 are phase-controlled. In particular, as a function of the desired displacement, i.e., as a function of the maximum height that is to be reached along the axis Z, an actuation voltage is applied, in particular of a unipolar type, to the piezoelectric bands 50a-50k comprised between 0 V (deformable structure 2 in the resting condition) and 40 V (deformable structure 2 in a condition of maximum extension along the axis Z). As indicated above, in these conditions, the actuation arms undergo deformation and bend, and the bending is all the more accentuated, the higher the voltage applied to the piezoelectric bands 50a-50k.

As illustrated in FIGS. 5A and 5B, the angle of deflection (measured with respect to the plane XY) of each sub-portion 38a, 39a, 40a, 41a, 47c increases as the latter move away from the supporting (also considered coupling and/or anchorage) elements 12, 14, 23-27, up to a maximum of 10° at the connection arms 18a', 18b', 20a', 20b'.

Figure 8:
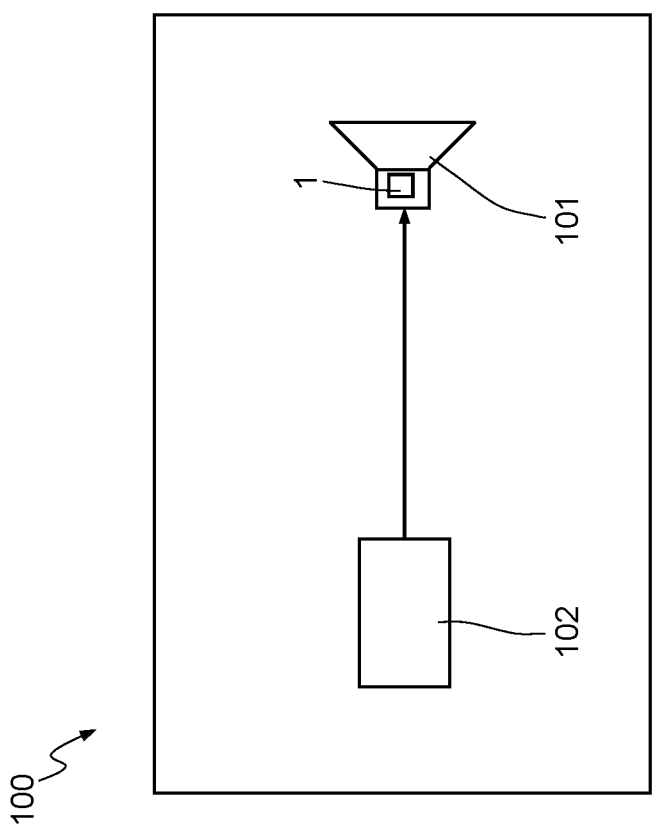
FIG. 8 illustrates an apparatus that comprises a MEMS actuator according to embodiments of this disclosure.

The actuator 1 finds application, for example, in a speaker 101 for use in a portable electronic apparatus 100, as illustrated in FIG. 8. The speaker 101 integrates the actuator 1, which, when actuated, has the function of displacing a diaphragm in order to generate an acoustic wave. A driving circuit 102 is configured to supply the operating voltage necessary for biasing the piezoelectrics, for actuation of the actuator 1 according to what has been described previously.

Other applications of the actuator device regard height micro-positioners, mechanical micro-elevators or nano-elevators (of a telescopic type, or miniature elevators), micro-contactors between two contacts with a certain gap along the axis Z, and the like.

The actuator 1 described herein presents numerous advantages. In particular, the technology described herein makes it possible to obtain, in use, a marked displacement of an actuation portion (here, the sub-portion 47c) with respect to a resting condition thereof. The total displacement is given by a sum of local displacements. Given the same maximum height reached by the actuation portion, the technology described herein enables reduction of the consumption of area as compared to a membrane actuator of a known type.

Finally, it is clear that modifications and variations may be made to the microelectronic device described and illustrated herein, without thereby departing from the scope of the technology described herein, as defined in the annexed claims.

Figure 6:
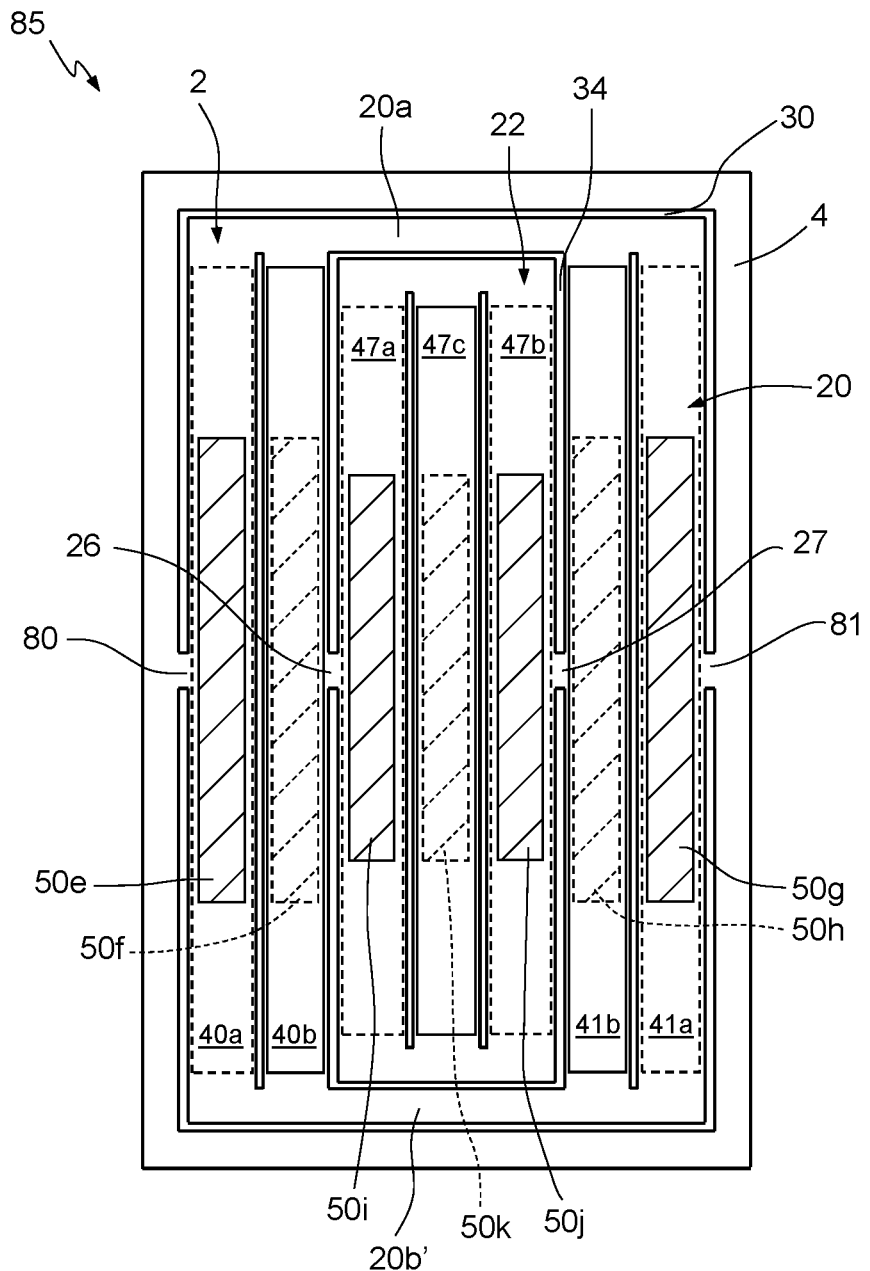
FIG. 6 illustrates a MEMS actuator according to a further embodiment of this disclosure.

For instance, as illustrated in FIG. 6, in an actuator 85 according to a further embodiment, the first functional sub-structure 18 is not present. In this case, the second functional sub-structure 20 is mechanically coupled to the frame 4 by supporting elements 80, 81 similar to the supporting elements 12, 14. The through trench 30 extends, in this case, between the frame 4 and the second functional sub-structure 20 except for the regions in which the supporting elements 80, 81 are present. The second functional sub-structure 20 is thus coupled to the frame 4 exclusively in a position corresponding to the supporting elements 80, 81, and is otherwise free to move with respect to the frame 4. The remaining technical characteristics, as likewise the operating principle, are in accordance with the ones already described with reference to the foregoing figures and the respective embodiments, and are thus not described any further herein for reasons of brevity.

Figure 7:
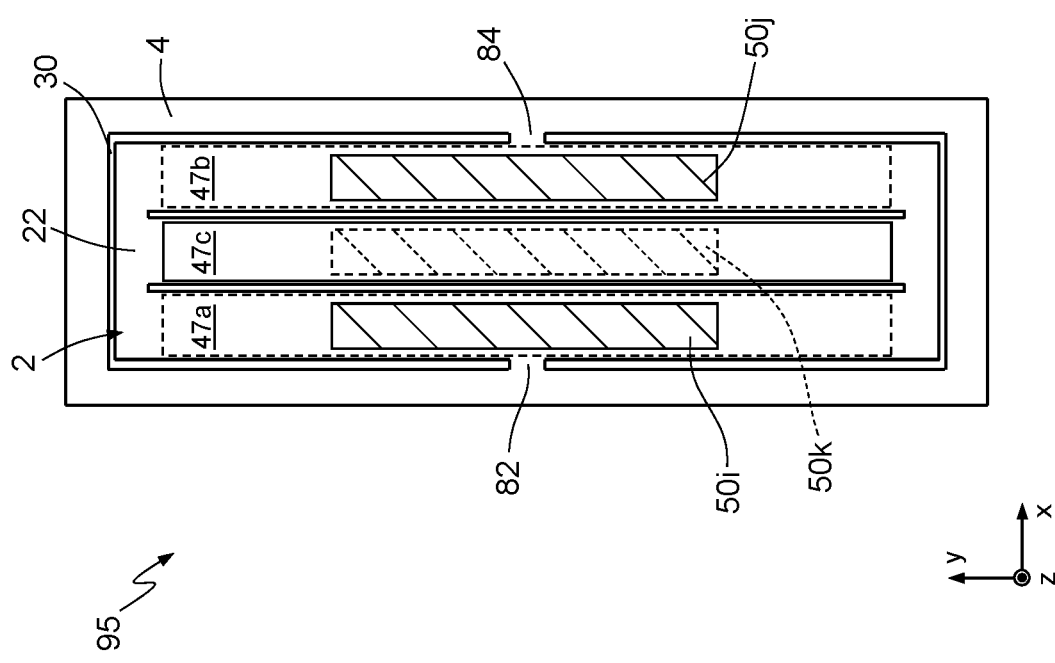
FIG. 7 illustrates a MEMS actuator according to a further embodiment of this disclosure.

In an actuator 95 according to a further embodiment (illustrated in FIG. 7), neither the first functional sub-structure 18 nor the second functional sub-structure 20 are present. In this case, the third functional sub-structure 22 is mechanically coupled to the frame 4 by supporting elements 82, 84 similar to the supporting elements 12, 14. The through trench 30 extends, in this case, between the frame 4 and the third functional sub-structure 22 except for the regions in which the supporting elements 82, 84 are present. The third functional sub-structure 22 is thus coupled to the frame 4 exclusively at the supporting elements 82, 84, and is otherwise free to move with respect to the frame 4. The remaining technical characteristics, as likewise the operating principle, are in accordance with the ones already described with reference to the foregoing figures and the respective embodiments, and thus are not described any further herein for reasons of brevity.

In a further embodiment (not illustrated in the figures), further functional sub-structures may be present similar to the functional sub-structure 18 or 20 (i.e., having a similar shape and comprising the same mechanical elements and the actuation piezoelectrics), said further functional sub-structures extending between the frame 4 and the first functional sub-structure 18 and/or between the first functional sub-structure 18 and the second functional sub-structure 20 and/or between the second functional sub-structure 20 and the third functional sub-structure 22.

Further, the examples indicated previously with reference to the dimensions, materials, and voltages for controlling the piezoelectrics are to be deemed as purely indicative of a possible non-limiting embodiment of the technology described herein. Variations in shape, materials, dimensions, and control voltages are possible and within the reach of the person skilled in the art on the basis of the teachings of the present disclosure.

The invention claimed is:

1. A micro-electro-mechanical (MEMS) actuator device, comprising:
   a frame;
   a first functional sub-structure positioned within the frame and mechanically coupled thereto by supporting elements, the first functional sub-structure being subdivided into first and second portions, the first portion being subdivided into first and second sub-portions separated from one another by a first through trench, the second portion being subdivided into first and second sub-portions separated from one another by a second through trench;
   first and second piezo-electric structures respectively carried by the first and second sub-portions of the first portion;
   third and fourth piezo-electric structures respectively carried by the first and second sub-portions of the second portion; and
   a third through trench extending between the frame and the first functional sub-structure except for regions in which the supporting elements are present.

2. The MEMS actuator of claim 1, wherein the frame is quadrangular in shape.

3. The MEMS actuator of claim 2, wherein the frame extends up to 2 mm along an x-axis and up to 2 mm along a y-axis.

4. The MEMS actuator of claim 2, wherein the supporting elements are quadrangular in shape.

5. The MEMS actuator of claim 4, wherein the supporting elements extend up to 20 µm along an x-axis and up to 85 µm along a y-axis.

6. The MEMS actuator of claim 5, wherein a thickness of the supporting elements is approximately 4 µm.

7. The MEMS actuator device of claim 1, wherein the first functional sub-structure is quadrangular in shape.

8. The MEMS actuator device of claim 1, wherein the frame is integrated within a substrate.

9. The MEMS actuator device of claim 1, wherein the frame is formed by a substrate.

10. The MEMS actuator device of claim 1, wherein the first and second sub-portions of the first portion of the first functional sub-structure are mutually parallel to one another; and wherein the first and second sub-portions of the second portion of the first functional sub-structure are mutually parallel to one another.

11. The MEMS actuator device of claim 10, wherein the first and second portions of the first sub-structure are symmetrical to one another across a longitudinal axis of the frame defining an axis of symmetry.

12. The MEMS actuator device of claim 1, wherein the first portion includes a first connection arm mechanically connecting a first end of the first sub-portion of the first portion to a first end of the second sub-portion of the first portion, and a second connection arm mechanically connecting a second end of the first sub-portion of the first portion to a second end of the second sub-portion of the first portion; and wherein the second portion includes a first connection arm mechanically connecting a first end of the first sub-portion of the second portion to a first end of the second sub-portion of the second portion, and a second connection arm mechanically connecting a second end of the first sub-portion of the second portion to a second end of the second sub-portion of the second portion.

13. The MEMS actuator device of claim 12, wherein the first and second connection arms of the first portion extend as prolongations of the first and second ends of the first and second sub-portions of the first portion; and wherein the first and second connection arms of the second portion extend as prolongations of the first and second ends of the first and second sub-portions of the second portion.

14. The MEMS actuator device of claim 1, wherein the first and second sub-portions of the first portion are configured to be bendable independently of one another with opposite orientations along a Z-axis; and wherein the first and second sub-portions of the second portion are configured to be bendable independently of one another with opposite orientations along the Z-axis.

15. The MEMS actuator device of claim 1, further comprising:
a second functional sub-structure positioned within the first functional sub-structure and mechanically coupled thereto by coupling elements; and
a fourth through trench extending between the first and second functional sub-structures except for regions in which the coupling elements are present.

16. The MEMS actuator device of claim 15, wherein the second functional sub-structure is quadrangular in shape.

17. The MEMS actuator device of claim 15, wherein the second functional sub-structure is subdivided into first, second, and third portions separated from one another by fifth and sixth through trenches; and further comprising fifth, sixth, and seventh piezo-electric structures respectively carried by the first, second, and third portions of the second functional sub-structure.

18. A micro-electro-mechanical (MEMS) actuator device, comprising:
a frame;
a functional sub-structure positioned within the frame and mechanically coupled thereto by supporting elements, the functional sub-structure being subdivided into first, second, and third portions separated from one another by first and second through trenches; and
first, second, and third piezo-electric structures respectively carried by the first, second, and third portions of the functional sub-structure;
a third through trench extending between the frame and the functional sub-structure except for regions in which the supporting elements are present.

19. The MEMS actuator of claim 18, wherein the frame is quadrangular in shape.

20. The MEMS actuator of claim 19, wherein the frame extends up to 2 mm along an x-axis and up to 2 mm along a y-axis.

21. The MEMS actuator of claim 19, wherein the supporting elements are quadrangular in shape.

22. The MEMS actuator of claim 21, wherein the supporting elements extend up to 20 µm along an x-axis and up to 85 µm along a y-axis.

23. The MEMS actuator of claim 22, wherein a thickness of the supporting elements is approximately 4 µm.

24. The MEMS actuator device of claim 18, wherein the first functional sub-structure is quadrangular in shape.

25. The MEMS actuator device of claim 18, wherein the frame is integrated within a substrate.

26. The MEMS actuator device of claim 18, wherein the frame is formed by a substrate.

* * * * *